(12) United States Patent
Moore et al.

(10) Patent No.: US 10,571,206 B2
(45) Date of Patent: *Feb. 25, 2020

(54) COOLING ASSEMBLY

(71) Applicant: Hewlett Packard Enterprise Development LP, Houston, TX (US)

(72) Inventors: David Allen Moore, Houston, TX (US); John P. Franz, Houston, TX (US); Tahir Cader, Houston, TX (US); Michael Lawrence Sabotta, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 24 days.

This patent is subject to a terminal disclaimer.

(21) Appl. No.: 15/935,450

(22) Filed: Mar. 26, 2018

(65) Prior Publication Data
US 2018/0216899 A1    Aug. 2, 2018

Related U.S. Application Data

(63) Continuation of application No. 14/432,207, filed as application No. PCT/US2012/057739 on Sep. 28, 2012, now Pat. No. 9,927,187.

(51) Int. Cl.
| | | |
|---|---|---|
| *G05D 23/00* | (2006.01) | |
| *F28F 13/06* | (2006.01) | |
| *H01L 23/473* | (2006.01) | |
| *H05K 7/20* | (2006.01) | |

(52) U.S. Cl.
CPC ............ *F28F 13/06* (2013.01); *H01L 23/473* (2013.01); *H05K 7/20781* (2013.01); *H05K 7/20809* (2013.01); *H01L 2924/0002* (2013.01)

(58) Field of Classification Search
CPC ................... F28F 13/06; H01L 23/473; H01L 2924/0002; H05K 7/20781; H05K 7/20809; G05D 23/1931
USPC ........................................................ 165/287
See application file for complete search history.

(56) References Cited

U.S. PATENT DOCUMENTS

| | | |
|---|---|---|
| 2,115,001 A | 4/1938 | Vernet |
| 2,115,501 A | 4/1938 | Vernet |
| 2,582,553 A | 1/1952 | McMurtrie |
| 3,279,876 A | 10/1966 | St Cyr |

(Continued)

FOREIGN PATENT DOCUMENTS

| | | |
|---|---|---|
| CN | 2519983 Y | 11/2002 |
| CN | 1581366 A | 2/2005 |

(Continued)

OTHER PUBLICATIONS

CN Third Office Action dated Dec 2, 2016, CN Patent Application No. 201280076099.2 dated Sep 28, 2012, State Intellectual Property Office of the P.R. China, 9 pages.

(Continued)

*Primary Examiner* — Davis D Hwu

(57) ABSTRACT

An assembly useable with a cooling system is provided herein. The assembly includes a support member, a channel, and a fluid control mechanism. The support member includes a receiving member formed therein to receive a thermal member. The channel is formed within the support member to carry a fluid therethrough. The fluid control mechanism is along the channel to control the flow of the fluid.

19 Claims, 10 Drawing Sheets

(56) References Cited

U.S. PATENT DOCUMENTS

| | | |
|---|---|---|
| 3,807,572 A | 4/1974 | Luvara et al. |
| 4,453,785 A | 6/1984 | Smith |
| 4,714,107 A | 12/1987 | Adsett |
| 4,716,722 A | 1/1988 | Rambach |
| 4,883,225 A | 11/1989 | Kitchens |
| 5,228,385 A | 7/1993 | Friedrich et al. |
| 5,370,178 A | 12/1994 | Agonafer et al. |
| 5,417,012 A | 5/1995 | Brightman et al. |
| 5,505,533 A | 4/1996 | Kammersgard |
| 5,514,906 A | 5/1996 | Love |
| 5,829,514 A | 11/1998 | Smith et al. |
| 5,867,369 A | 2/1999 | Antonuccio |
| 5,918,469 A | 7/1999 | Cardella |
| 5,964,092 A | 10/1999 | Tozuka et al. |
| 5,971,166 A | 10/1999 | Ong |
| 5,982,616 A | 11/1999 | Moore |
| 5,986,882 A | 11/1999 | Ekrot et al. |
| 6,084,769 A | 7/2000 | Moore et al. |
| 6,111,749 A | 8/2000 | Lamb et al. |
| 6,234,842 B1 | 5/2001 | Keay et al. |
| 6,305,180 B1 | 10/2001 | Miller et al. |
| 6,333,849 B1 | 12/2001 | Donahoe et al. |
| 6,377,453 B1 | 4/2002 | Belady |
| 6,594,148 B1 | 7/2003 | Nguyen et al. |
| 6,600,649 B1 | 7/2003 | Tsai et al. |
| 6,796,372 B2 | 9/2004 | Baer |
| 6,879,486 B1 | 4/2005 | Banton et al. |
| 6,987,673 B1 | 1/2006 | French et al. |
| 7,051,802 B2 | 5/2006 | Baer |
| 7,057,893 B2 | 6/2006 | Nicolai et al. |
| 7,106,590 B2 | 9/2006 | Chu et al. |
| 7,133,283 B2 | 11/2006 | Faneuf et al. |
| 7,298,619 B1 | 11/2007 | Malone et al. |
| 7,318,322 B2 | 1/2008 | Ota et al. |
| 7,393,236 B2 | 7/2008 | Thompson et al. |
| 7,397,661 B2 | 7/2008 | Campbell et al. |
| 7,403,384 B2 | 7/2008 | Pflueger |
| 7,403,392 B2 | 7/2008 | Attlesey et al. |
| 7,450,378 B2 | 11/2008 | Nelson et al. |
| 7,539,020 B2 | 5/2009 | Chow et al. |
| 7,564,685 B2 | 7/2009 | Clidaras et al. |
| 7,647,787 B2 | 1/2010 | Belady et al. |
| 7,715,194 B2 | 5/2010 | Brewer et al. |
| 7,718,891 B2 | 5/2010 | Adducci et al. |
| 7,724,524 B1 | 5/2010 | Campbell et al. |
| 7,764,494 B2 | 7/2010 | Balzano |
| 7,800,900 B1 | 9/2010 | Noteboom et al. |
| 7,907,402 B2 | 3/2011 | Caveney |
| 7,907,409 B2 | 3/2011 | Wyatt et al. |
| 7,916,480 B2 | 3/2011 | Woody et al. |
| 7,916,483 B2 | 3/2011 | Campbell et al. |
| 7,957,132 B2 | 6/2011 | Fried |
| 7,961,475 B2 | 6/2011 | Campbell et al. |
| 7,971,632 B2 | 7/2011 | Eriksen |
| 8,004,832 B2 | 8/2011 | Brunschwiller et al. |
| 8,014,150 B2 | 9/2011 | Campbell et al. |
| 8,027,162 B2 | 9/2011 | Campbell et al. |
| 8,050,036 B2 | 11/2011 | Suzuki et al. |
| 8,079,481 B2 | 12/2011 | Canfield et al. |
| 8,089,766 B2 | 1/2012 | Attlesey |
| 8,164,901 B2 | 4/2012 | Neudorfer |
| 8,194,406 B2 | 6/2012 | Campbell et al. |
| 8,327,656 B2 | 12/2012 | Tutunoglu et al. |
| 8,351,206 B2 | 1/2013 | Campbell et al. |
| 8,369,090 B2 | 2/2013 | Chester et al. |
| 8,526,182 B2 | 9/2013 | Chen et al. |
| 8,755,192 B1 | 6/2014 | Schrempp et al. |
| 8,844,732 B2 | 9/2014 | Wu et al. |
| 9,803,937 B2 | 10/2017 | Franz et al. |
| 9,927,187 B2 | 3/2018 | Moore et al. |
| 2002/0021557 A1 | 2/2002 | Ishimine et al. |
| 2002/0163782 A1 | 11/2002 | Cole et al. |
| 2003/0128516 A1 | 7/2003 | Faneuf et al. |
| 2003/0147214 A1 | 8/2003 | Patel et al. |
| 2003/0231467 A1 | 12/2003 | Replogle et al. |
| 2004/0069455 A1 | 4/2004 | Lindemuth et al. |
| 2004/0070949 A1 | 4/2004 | Oikawa et al. |
| 2004/0201335 A1 | 10/2004 | Davis |
| 2004/0221604 A1 | 11/2004 | Ota et al. |
| 2005/0022967 A1 | 2/2005 | Hall |
| 2005/0082037 A1 | 4/2005 | Thayer et al. |
| 2005/0128705 A1 | 6/2005 | Chu et al. |
| 2005/0168945 A1 | 8/2005 | Coglitore |
| 2005/0199372 A1 | 9/2005 | Frazer et al. |
| 2005/0265004 A1 | 12/2005 | Coglitore et al. |
| 2005/0270751 A1 | 12/2005 | Coglitore et al. |
| 2005/0280986 A1 | 12/2005 | Coglitore et al. |
| 2005/0286235 A1 | 12/2005 | Randall et al. |
| 2006/0002086 A1 | 1/2006 | Teneketges |
| 2006/0012955 A1 | 1/2006 | Vinson et al. |
| 2006/0012959 A1 | 1/2006 | Lee et al. |
| 2006/0065874 A1 | 3/2006 | Campbell et al. |
| 2006/0126296 A1 | 6/2006 | Campbell et al. |
| 2006/0152238 A1 | 7/2006 | Beaman |
| 2006/0176664 A1 | 8/2006 | Casebolt |
| 2006/0176665 A1 | 8/2006 | Matsushima et al. |
| 2006/0232945 A1 | 10/2006 | Chu et al. |
| 2006/0278372 A1 | 12/2006 | Lai et al. |
| 2007/0006992 A1 | 1/2007 | Liu et al. |
| 2007/0034354 A1 | 2/2007 | Tung et al. |
| 2007/0091579 A1 | 4/2007 | Larson et al. |
| 2007/0101194 A1 | 5/2007 | Lockwood et al. |
| 2007/0119569 A1 | 5/2007 | Campbell et al. |
| 2007/0163749 A1 | 7/2007 | Miyahara |
| 2007/0188996 A1 | 8/2007 | Liang |
| 2007/0235180 A1 | 10/2007 | Ouyang et al. |
| 2007/0258211 A1 | 11/2007 | Sonobe et al. |
| 2007/0259616 A1 | 11/2007 | Scattolin et al. |
| 2007/0274043 A1 | 11/2007 | Shabany |
| 2007/0289718 A1 | 12/2007 | McCordic et al. |
| 2007/0291452 A1 | 12/2007 | Gilliland et al. |
| 2007/0297136 A1 | 12/2007 | Konshak |
| 2008/0024977 A1 | 1/2008 | Coglitore et al. |
| 2008/0037217 A1 | 2/2008 | Murakami et al. |
| 2008/0049396 A1 | 2/2008 | Campbell et al. |
| 2008/0055846 A1 | 3/2008 | Clidaras et al. |
| 2008/0060372 A1 | 3/2008 | Hillis et al. |
| 2008/0232064 A1 | 9/2008 | Sato et al. |
| 2008/0239649 A1 | 10/2008 | Bradicich et al. |
| 2008/0245083 A1 | 10/2008 | Tutunoglu et al. |
| 2008/0259566 A1 | 10/2008 | Fried |
| 2008/0271878 A1 | 11/2008 | Harvey et al. |
| 2009/0021907 A1 | 1/2009 | Mann et al. |
| 2009/0052136 A1 | 2/2009 | Chung |
| 2009/0065178 A1 | 3/2009 | Kasezawa |
| 2009/0086426 A1 | 4/2009 | Brandon |
| 2009/0086456 A1 | 4/2009 | Milo et al. |
| 2009/0120622 A1 | 5/2009 | Koch |
| 2009/0129011 A1 | 5/2009 | Balzano |
| 2009/0225514 A1 | 9/2009 | Correa et al. |
| 2009/0260777 A1 | 10/2009 | Attlesey |
| 2009/0262495 A1 | 10/2009 | Neudorfer |
| 2009/0266515 A1 | 10/2009 | Oikawa |
| 2009/0267033 A1 | 10/2009 | Zhang |
| 2010/0003911 A1 | 1/2010 | Graczyk et al. |
| 2010/0032142 A1 | 2/2010 | Copeland et al. |
| 2010/0033931 A1 | 2/2010 | Miyazawa et al. |
| 2010/0051235 A1 | 3/2010 | Mori et al. |
| 2010/0103614 A1 | 4/2010 | Campbell et al. |
| 2010/0103618 A1 | 4/2010 | Campbell et al. |
| 2010/0110621 A1 | 5/2010 | Dunn et al. |
| 2010/0141379 A1 | 6/2010 | Tucker |
| 2010/0149754 A1 | 6/2010 | Chapel et al. |
| 2010/0165565 A1 | 7/2010 | Hellriegal et al. |
| 2010/0175866 A1 | 7/2010 | Tani et al. |
| 2010/0226094 A1 | 9/2010 | Attlesey et al. |
| 2010/0236772 A1 | 9/2010 | Novotny et al. |
| 2010/0248609 A1 | 9/2010 | Tresh et al. |
| 2010/0263830 A1 | 10/2010 | Noteboom et al. |
| 2010/0290190 A1 | 11/2010 | Chester et al. |
| 2010/0319883 A1 | 12/2010 | Facusse |
| 2010/0326628 A1 | 12/2010 | Campbell et al. |
| 2011/0045759 A1 | 2/2011 | Rasmussen et al. |
| 2011/0056674 A1 | 3/2011 | Campbell et al. |

(56) References Cited

U.S. PATENT DOCUMENTS

| | | |
|---|---|---|
| 2011/0056675 A1 | 3/2011 | Barringer et al. |
| 2011/0060470 A1 | 3/2011 | Campbell et al. |
| 2011/0073726 A1 | 3/2011 | Bergesch |
| 2011/0079376 A1 | 4/2011 | Loong et al. |
| 2011/0192568 A1 | 8/2011 | Hsieh |
| 2011/0240281 A1 | 10/2011 | Avery |
| 2011/0242760 A1 | 10/2011 | Bott et al. |
| 2011/0303394 A1 | 12/2011 | Branton |
| 2011/0315353 A1 | 12/2011 | Campbell et al. |
| 2011/0315367 A1 | 12/2011 | Romero et al. |
| 2012/0019115 A1 | 1/2012 | Dunwoody et al. |
| 2012/0050984 A1 | 3/2012 | Peng et al. |
| 2012/0069514 A1 | 3/2012 | Ross |
| 2012/0116590 A1 | 5/2012 | Florez-Larrahondo et al. |
| 2012/0127655 A1 | 5/2012 | Tung et al. |
| 2012/0138285 A1 | 6/2012 | Tsubaki et al. |
| 2012/0273185 A1* | 11/2012 | Arimilli ............ G05D 23/1931 165/287 |
| 2012/0325126 A1 | 12/2012 | Tran et al. |
| 2013/0077232 A1 | 3/2013 | Nordin et al. |
| 2013/0081792 A1 | 4/2013 | Tufty et al. |
| 2013/0141863 A1 | 6/2013 | Ross et al. |
| 2013/0163185 A1 | 6/2013 | Gilges et al. |
| 2013/0308267 A1 | 11/2013 | Wu et al. |
| 2014/0033753 A1 | 2/2014 | Lu et al. |
| 2014/0038510 A1 | 2/2014 | Bailey et al. |
| 2014/0049146 A1 | 2/2014 | Kamaludeen et al. |
| 2014/0049914 A1 | 2/2014 | Campbell et al. |
| 2014/0085821 A1 | 3/2014 | Regimbal et al. |
| 2015/0003009 A1 | 1/2015 | Moore et al. |
| 2016/0066478 A1 | 3/2016 | Van Den Bergen |

FOREIGN PATENT DOCUMENTS

| | | |
|---|---|---|
| CN | 1653612 | 8/2005 |
| CN | 1956101 A | 5/2007 |
| CN | 101111734 B | 1/2008 |
| CN | 101132688 | 2/2008 |
| CN | 100455175 C | 1/2009 |
| CN | 101398706 A | 4/2009 |
| CN | 101509732 | 8/2009 |
| CN | 101568248 A | 10/2009 |
| CN | 101893921 | 11/2010 |
| CN | 201654658 U | 11/2010 |
| CN | 102014508 A | 4/2011 |
| CN | 102014598 A | 4/2011 |
| CN | 102089727 A | 6/2011 |
| CN | 102159051 | 8/2011 |
| CN | 102159058 | 8/2011 |
| CN | 102189311 A | 9/2011 |
| CN | 102577653 A | 7/2012 |
| EP | 1860695 | 11/2007 |
| EP | 1481467 B1 | 6/2010 |
| EP | 2490303 A1 | 8/2012 |
| JP | 63-091376 A | 4/1988 |
| JP | 02-300890 A | 12/1990 |
| JP | 11220281 | 8/1999 |
| JP | 2000059062 | 2/2000 |
| JP | 2000-076537 A | 3/2000 |
| JP | 2000-166662 A | 6/2000 |
| JP | 2001168256 | 6/2001 |
| JP | 2004-295718 A | 10/2004 |
| JP | 2005-228216 A | 8/2005 |
| JP | 2007-123547 A | 5/2007 |
| JP | 2008-509542 A | 3/2008 |
| JP | 2010004736 | 1/2010 |
| JP | 2011108891 | 6/2011 |
| JP | 2012-248576 A | 12/2012 |
| JP | 2013-506996 A | 2/2013 |
| KR | 10-2009-0102804 A | 9/2009 |
| KR | 10-2010-0019308 A | 2/2010 |
| KR | 100944890 | 3/2010 |
| KR | 20110004857 | 1/2011 |
| KR | 101103394 | 1/2012 |
| TW | M254049 | 12/2004 |
| TW | M312877 | 5/2007 |
| TW | M421677 U | 1/2012 |
| TW | 201221034 A | 5/2012 |
| TW | 201228570 A | 7/2012 |
| TW | 201249322 A | 12/2012 |
| WO | WO-0242703 | 5/2002 |
| WO | 2003/107523 A1 | 12/2003 |
| WO | WO-2010062553 | 6/2010 |
| WO | WO-2011073668 | 6/2011 |
| WO | WO-2011092333 | 8/2011 |
| WO | WO-201113316 | 10/2011 |
| WO | WO-2011133166 | 10/2011 |
| WO | 2012/028718 A1 | 3/2012 |
| WO | WO-PCT/US2012 /028718 | 3/2012 |
| WO | WO-PCT/US2012 /028744 | 3/2012 |
| WO | 2012/057739 A1 | 5/2012 |
| WO | WO-PCT/US2012 /062874 | 10/2012 |
| WO | 2012/157247 A1 | 11/2012 |
| WO | 2013/119243 A1 | 8/2013 |
| WO | 2014/051604 A1 | 4/2014 |
| WO | 2014/120182 A1 | 8/2014 |
| WO | WO-2012024564 | 2/2017 |

OTHER PUBLICATIONS

EPO, Extended European Search Report, dated May 3, 2016, EP App. No. 12885470.0.
Dehbi, A, et al., Efficient Electrothermal Simulation of Power Electronics for Hybrid Electric Vehicle, Apr. 20-23, 2008, 7 pages.
Moore, David A., et al.; "Non-Final Office Action cited in U.S. Appl. No. 14/376,137" dated Oct. 13, 2017; 31 pages.
Moore, et al.; Non-Final Office Action cited in U.S. Appl. No. 14/376,124; dated Jun. 14, 2017; 16 pages.
PCT/ISA/KR, International Search Report, dated Apr. 29, 2013, PCT/US2012/057739, 9 pps.
Scofield, Bill., "Alcatel-lucent Modular Cooling System," 2010, 14 pages.
Unknown., "wiseGeek: What is a Relay Rack?" Retrieved from http://www.wisegeek.com/what-is-a-relay-rack.htm, Aug. 2011, 4 pages.
International Search Report and Written Opinion received for PCT Patent Application No. PCT/US2013/024037, dated Oct. 25, 2013, 15 pages.
International Search Report and Written Opinion received for PCT Patent Application No. PCT/US2012/062874, dated Nov. 20, 2013, 9 pages.
International Search Report and Written Opinion received for PCT Patent Application No. PCT/US2012/028744, dated Nov. 12, 2012, 7 pages.
International Search Report and Written Opinion received for PCT Patent Application No. PCT/US2012/028718, dated Nov. 14, 2012, 7 pages.
International Search Report and Written Opinion received for PCT Patent Application No. PCT/US2012/024564, dated Oct. 12, 2012, 8 pages.
International Preliminary Report on Patentability received for PCT Patent Application No. PCT/US2013/024037, dated Aug. 13, 2015, 11 pages.
International Preliminary Report on Patentability received for PCT Patent Application No. PCT/US2012/062874, dated May 14, 2015, 8 pages.
International Preliminary Report on Patentability received for PCT Patent Application No. PCT/US2012/057739, dated Apr. 9, 2015, 6 pages.
International Preliminary Report on Patentability received for PCT Patent Application No. PCT/US2012/028744, dated Sep. 25, 2014, 6 pages.
International Preliminary Report on Patentability received for PCT Patent Application No. PCT/US2012/028718, dated Sep. 25, 2018, 6 pages.
International Preliminary Report on Patentability received for PCT Patent Application No. PCT/US2012/024564, dated Aug. 21, 2014, 7 pages.

(56) References Cited

OTHER PUBLICATIONS

European Search Report and Search Opinion Received for EP Application No. 13873193.0, dated Aug. 24, 2016, 9 pages.
European Search Report and Search Opinion Received for EP Application No. 12887787.5, dated May 30, 2016, 8 pages.
European Search Report and Search Opinion Received for EP Application No. 12871555.4, dated Feb. 12, 2016, 11 pages.
European Search Report and Search Opinion Received for EP Application No. 12871455.7, dated Oct. 12, 2015, 12 pages.
European Search Report and Search Opinion Received for EP Application No. 12867753.1, dated Aug. 9, 2016, 8 pages.

\* cited by examiner

800

```
┌─────────────────────────────────────┐
│ RECEIVE HEAT FROM AN ELECTRONIC DEVICE │
│       WITH A COOLING SYSTEM         │
│                820                  │
└─────────────────────────────────────┘
                  │
                  ▼
┌─────────────────────────────────────┐
│  DISTRIBUTE A FLUID TO THE COOLING  │
│               SYSTEM                │
│                840                  │
└─────────────────────────────────────┘
                  │
                  ▼
┌─────────────────────────────────────┐
│  REMOVE THE FLUID WITH THE HEAT FROM│
│          THE COOLING SYSTEM         │
│                860                  │
└─────────────────────────────────────┘
```

*Fig. 8*

COOLING ASSEMBLY

PRIORITY INFORMATION

This application is a continuation of U.S. application Ser. No. 14/432,207 filed on Mar. 29, 2015, which claims priority to International Application No. PCT/US2012/057739 filed on Sep. 28, 2012. The entire contents of which are incorporated herein by reference.

BACKGROUND

Electronic devices have temperature requirements. Heat from the use of the electronic devices is controlled using cooling systems. Examples of cooling systems include air and liquid cooling.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 8 illustrates a flow chart of a method to cool an electronic device according to an example.

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs must balance conflicts between power density, spatial layout, temperature requirements, acoustic noise, and other factors. Air cooling systems typically use heat sinks and fans to remove "waste" heat from the system. The use of heat sinks and fans increase the electrical power required to operate an electronic device in an electronic system, and may cause excessive acoustic noise and lower system density. Liquid cooling can be more efficient than air cooling; however, the liquid cooling typically includes plumbing connections within the electronic devices. As the liquid goes through the plumbing connections the risk of leakage of liquid within the electronic device is introduced.

In examples, an assembly useable with a cooling system is provided. The assembly connects to an electronic device. The heat from the electronic device transfers to the assembly via a dry disconnect. The assembly includes a support member, a channel, and a fluid control mechanism. The support member supports a thermal member. The support member includes a receiving member formed to receive a thermal member. The channel is formed within the support member to carry a fluid therethrough. The fluid control mechanism is along the channel to control the flow of the fluid. The heat is transferred from the electronic device to the thermal member. Fluid that contacts the thermal member removes the heat from the thermal member and the fluid is removed from the assembly via the channels. The assembly is outside of the electronic device to enable the liquid cooling to occur away from the electronic device, reducing the risk of fluid leakage within the electronic device.

Figure 1:
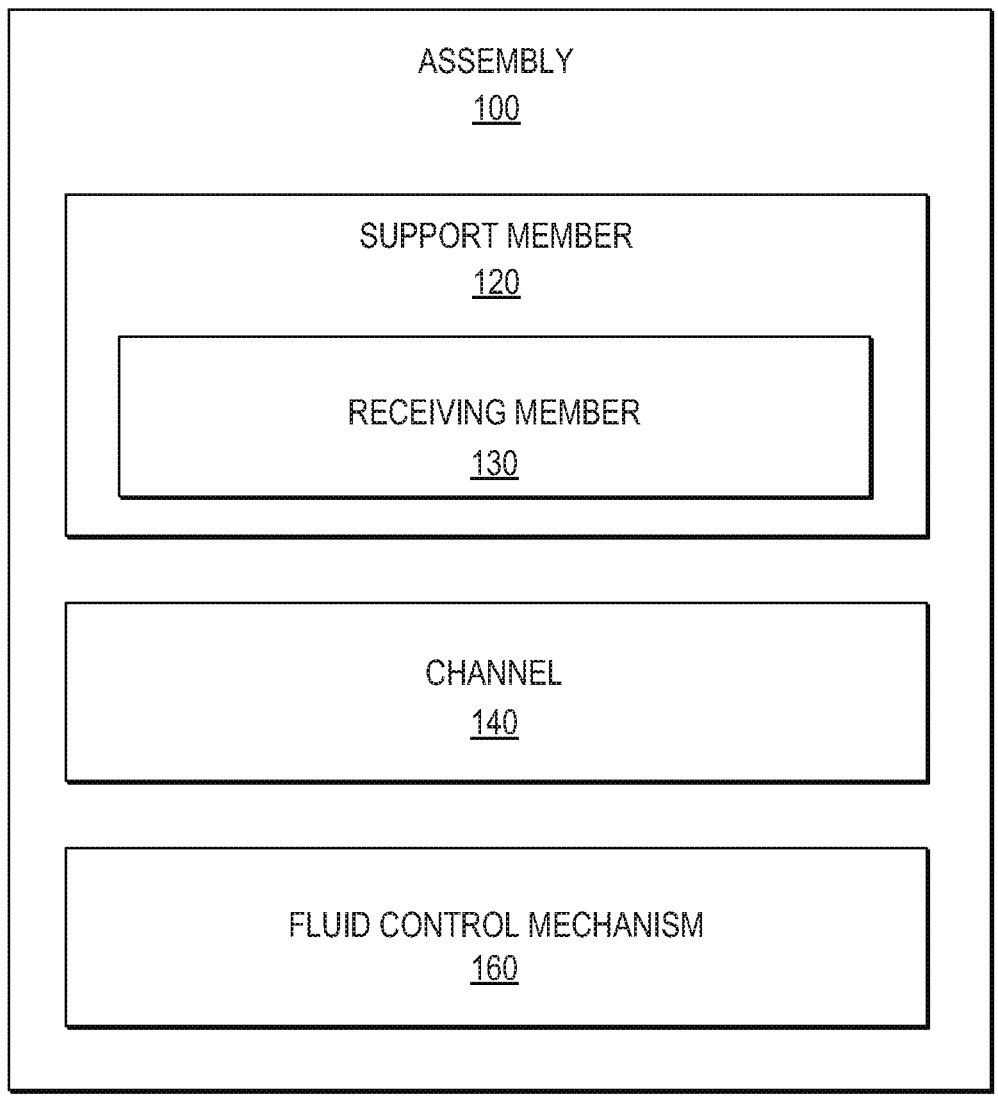
FIG. 1 illustrates a block diagram of an assembly useable with a cooling system according to an example.

FIG. 1 illustrates a block diagram of an assembly 100 useable with a cooling system according to an example. The assembly 100 includes a support member 120, a receiving member 130, a channel 140, and a fluid control mechanism 160. The support member 120 is a structural member that is positioned in proximity to or adjacent to an electronic device. The support member 120 supports a thermal member. The support member 120 includes the receiving member 130. The receiving member 130 is formed to receive a thermal member. The thermal member is a structure formed to include thermally conductive materials that when placed in contact with another thermally conductive material receives heat therefrom. For example, the thermal member receives heat from an electronic device.

The channel 140 is formed within the support member 120 to carry a fluid therethrough. The channel 140 receives the fluid, provides and/or distributes the fluid across a thermal member, and removes the fluid from a thermal member and/or the support member 120. The channel 140 may include one or a plurality of enclosed channels or portions depending on the configuration of the support member 120. The fluid control mechanism 160 is along or formed in the channel 140 to control the flow of the fluid therethrough. For example, the fluid control mechanism 160 evenly distributes the fluid among the thermal members.

Figure 2:
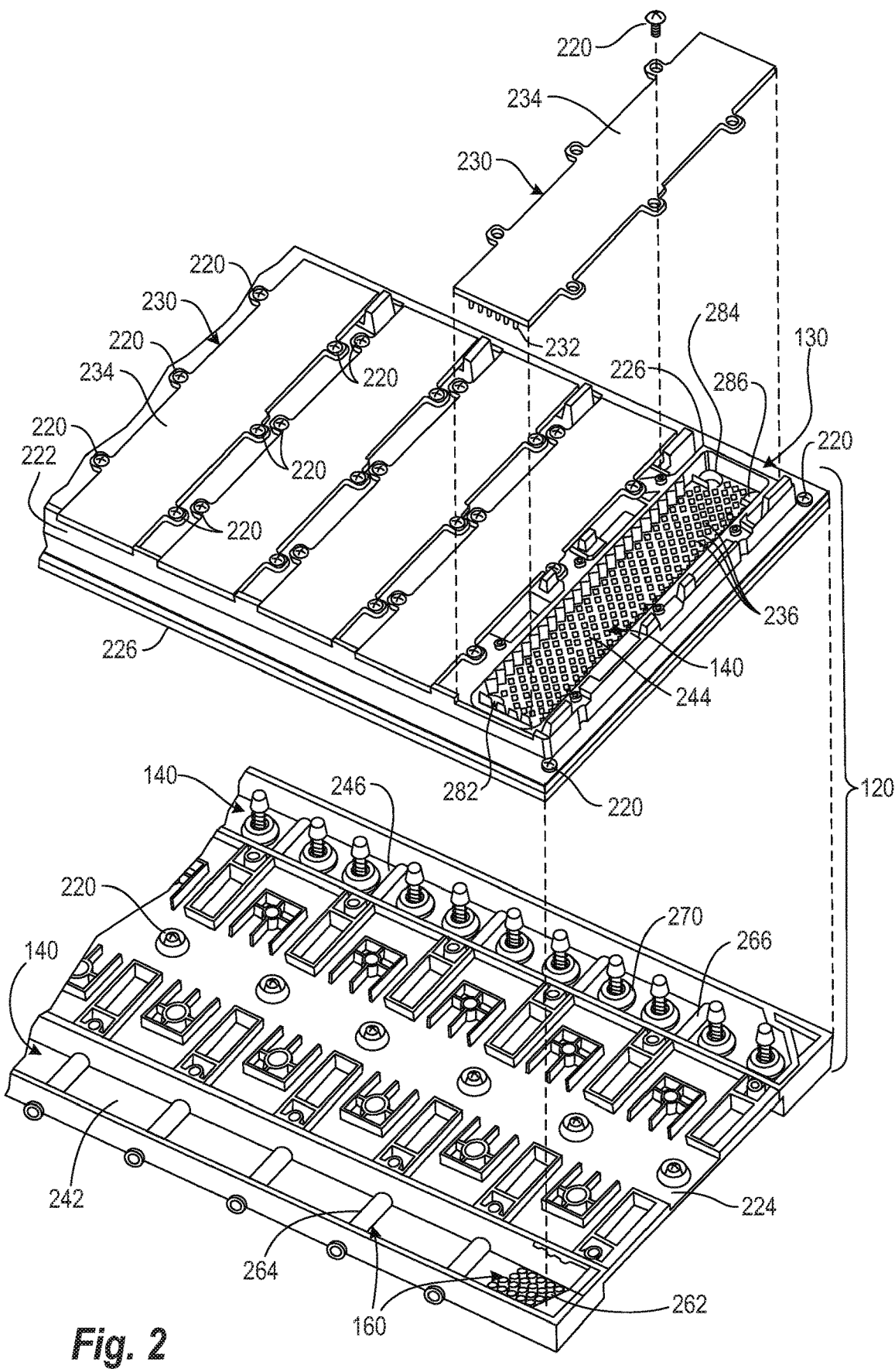
FIG. 2 illustrates an exploded view of the assembly according to an example.

FIGS. 2-4C further illustrate the assembly 100 of FIG. 1 according to examples. FIG. 2 illustrates an exploded view of the assembly 100 according to an example. The assembly 100 includes the support member 120, the receiving member 130, the channel 140, and the fluid control mechanism 160.

Referring to FIG. 2, the support member 120 includes a base portion 222 and a cover portion 224 connectable to the base portion 222. The base portion 222 and the cover portion 224 may be connected to one another using, for example, a fastener 220, such as a clip, an adhesive gasket, and/or a screw that holds the base portion 222 and the cover portion 224 together. A plurality of fasteners 220 are illustrated along the edges and/or internal portions of the support member 120. The arrangement of the fasteners 220 may vary depending on the configuration of the support member 120, base portion 222, and cover portion 224. The use of a sealing member 226, such as a gasket provides a fluid-tight seal.

The assembly 100 further includes a thermal member 230. The support member 120 receives the thermal member 230 via the receiving member 130 that is formed to receive a thermal member 230. The receiving member 130 is illustrated under the thermal member 230 in FIG. 2, such that the receiving member 130 receives or mates with the thermal member 230. The thermal member 230 is held into place with, for example, an adhesive distributed on the surface of at least one of the thermal member 230 and the receiving member 130 and/or fasteners 220, such as screws.

FIG. 2 illustrates a seal member 226 between the base portion 222 and the cover portion 224 that provide a fluid-tight seal therebetween. The seal member 226 may be a separate seal, such as a gasket, or integrated into structure of the support member 120. Another example of the seal member 226 is illustrated between the base portion 222 and the thermal member 230 in FIG. 4A to provide a fluid tight seal therebetween.

The thermal member 230 includes an array of cooling pins 232 on one side and a mating member 234 on an opposite side. The array of cooling pins 232 remove heat from the thermal member 230. The array of cooling pins 232 may include a plurality of solid protrusions arranged in an array of columns and rows. The solid protrusions extend from a planar portion of the thermal member 230 and extend towards the receiving member 130. The mating member 234 receives heat from an electronic device. The support member 120 forms a fluid-tight enclosure when all of the thermal members 230 are installed or connected thereto and the seal member 226 is placed between the base portion 222 and the cover portion 224 and between the base portion 222 and the thermal member 230.

The channel 140 is formed within the support member 120 between the base portion 222 and the cover portion 224 to carry a fluid therethrough. The fluid enters the assembly 100 at a predefined temperature (range) and rises in temperature as the fluid absorbs heat from the thermal members 230. The fluid typically exits the assembly 100 at a higher temperature.

Figure 3:
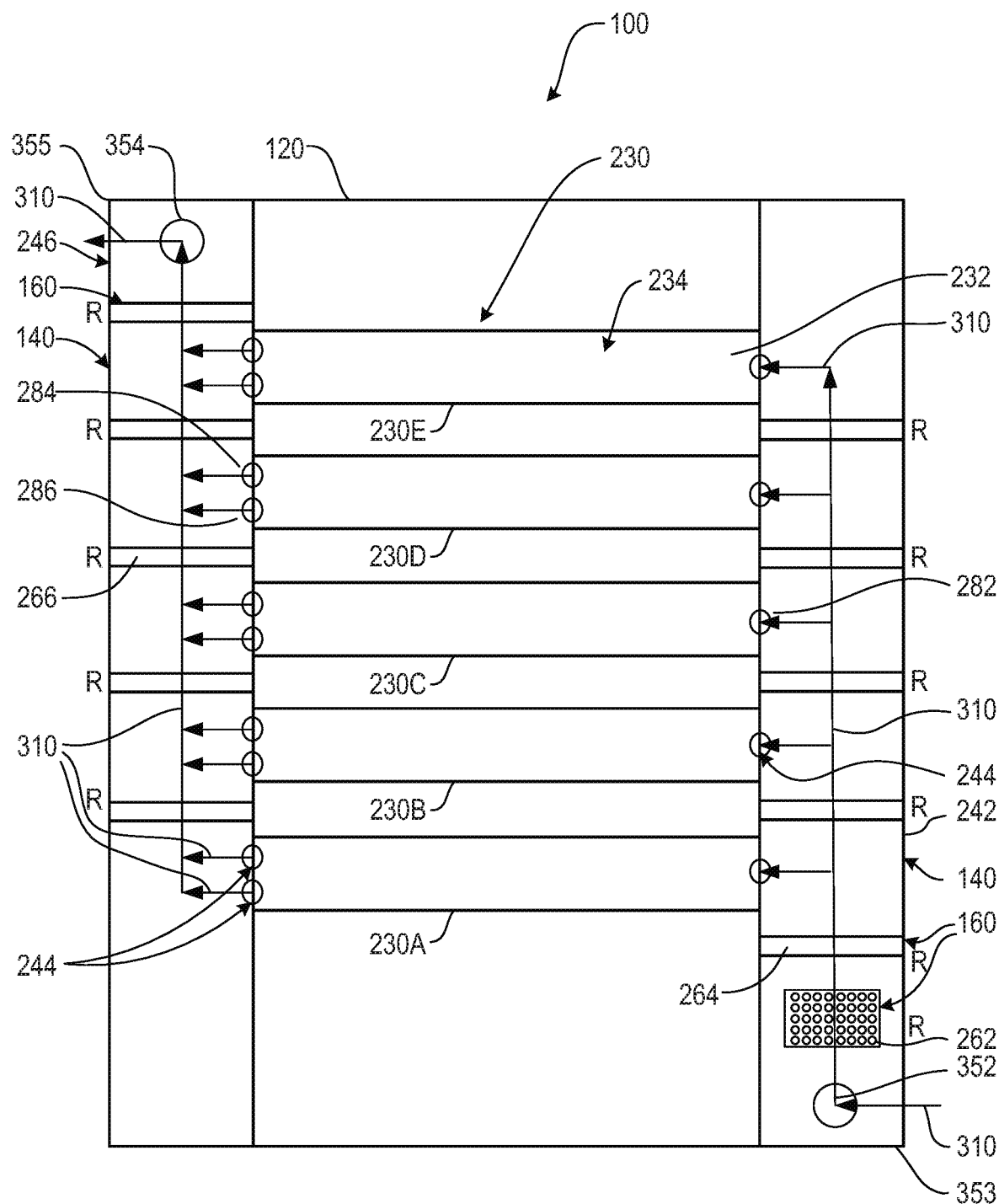
FIG. 3 illustrates a schematic diagram of the flow of the fluid through the assembly according to an example.

FIG. 3 illustrates a schematic diagram of the flow of a fluid 310 through the assembly 100 according to an example. The channel 140 receives the fluid 310, provides the fluid 310 to a thermal member 230, and removes the fluid 310 from the thermal member 230. This is the only fluid exchange required in the assembly 100. The assembly 100 provides an efficient liquid cooling method that cools electronic devices by removing heat transported to the outer surface of electronic devices without the risk of leakage within the electronic device. For example, in a server the liquid cooling occurs at the rack level instead of the server level where the central processing unit and other electronic components are located Referring to FIGS. 2-3, the channel 140 as illustrated includes an inlet channel 242, a cooling channel 244, and an outlet channel 246. The inlet channel 242 receives the fluid 310 and distributes the fluid 310 across the thermal member 230, such as thermal members 230A-E. The outlet channel 246 removes the fluid 310 received from the thermal member 230. The outlet channel 246 and the inlet channel 242 are connectable to a thermal member 230.

The thermal member 230 may be directly connected to the inlet channel 242 and the outlet channel 246, such that the cooling channel 244 is formed between the thermal member 230 and the receiving member 130. For example, the cooling channel 244 is a channel or cavity formed between the base portion 222 and the thermal member 230 that the fluid 310 to flow therethrough, such that the fluid 310 flows across the array of cooling pins 232. The inlet channel 242 may receive the fluid 310 via an inlet member 352 connected to the inlet channel 242, and remove the fluid 310 from the assembly 100 via an outlet member 354 connected to the outlet channel 246, as illustrated in FIGS. 2-3. Alternatively, the thermal member 230 may be connected to a supplemental channel that extends from the inlet channel 242 and the outlet channel 246 and connects to the thermal member 230. The supplemental channel provides and/or distributes the fluid 310 to a thermal member 230, such that the fluid 310 flows across the array of cooling pins 232 and receives the fluid 310 from the thermal member 230.

The fluid control mechanism 160 is along or formed in the inlet channel 242 to evenly distribute the fluid 310 to a thermal member 230. The fluid control mechanism 160 also controls the flow of the fluid 310 at various locations within the inlet channel 242 and/or the outlet channel 246, such as the flow of the fluid 310 across the thermal members 230 and along the outlet channel 246. Referring to FIG. 3, the fluid control mechanism 160 includes, for example, a protrusion in the inlet channel 242 that resists the flow of the fluid 310, such that the fluid 310 is evenly distributed to each of the thermal members 230A-E. In other words, approximately the same velocity and pressure of fluid 310 is distributed to the first thermal member 230A and the last thermal member 230E. The fluid control mechanism 160 may similarly control the flow of the fluid 310 through the outlet channel 246, to stabilize the pressure of the fluid throughout the support member 120.

For example, the fluid control mechanism 160 of FIG. 3 includes an array of protrusions 262 along the inlet channel 242 in proximity to the inlet member 352, a first plurality of elongated protrusions 264 along the inlet channel 242, and a second plurality of elongated protrusions 266 along the outlet channel 246. The array of protrusions 262 that extend across the inlet channel 242 initially slow or resist the flow of the fluid 310 as it enters the inlet channel 242. The first plurality of elongated protrusions 264 are illustrated as semi-cylindrical protrusions located before each of the thermal members 230 to resist the flow of the fluid 310. A small amount of flow resistance is created in the inlet channel 242 by the first plurality of elongated protrusions 264, For example, the first plurality of elongated protrusions 264 evenly distribute the fluid 310 to the thermal members 230 via the inlet apertures 282 and provide each of the thermal members 230 with the fluid 310 having approximately the same velocity and pressure.

The second plurality of elongated protrusions 266 resist the flow of fluid 310 between the thermal members 230 and the outlet channel 246 as the fluid moves out of the assembly 100. The second plurality of elongated protrusions 266 are illustrated as semi-cylindrical protrusions located after each of the thermal members 230 to control the flow of the fluid 310 as it moves along the outlet channel 246. The second plurality of elongated protrusions 266 create a small amount of flow resistance in the outlet channel 246. As illustrated in FIG. 3, the same number of first and second plurality of elongated protrusions 264, 266 are located in the inlet channel 242 and the outlet channel 246. The symmetry enables the flow of the fluid 310 to be similarly controlled in both directions.

The assembly 100 further includes a thermal member 230 in each of the receiving members 130 illustrated in FIG. 3. The receiving member 130 is illustrated as extending between the inlet channel 242 and the outlet channel 246. The cooling channel 244 is formed between the receiving member 130 and the thermal member, such that the fluid 310 flows across the thermal member 230, The cooling channel 244 causes the fluid 310 to flow from the inlet channel 242 to the outlet channel 246 through the thermal member 230.

An inlet aperture 282 formed between the receiving member 130 and the inlet channel 242 to provide and/or distribute the fluid 310 to the thermal member 230. The fluid 310 exits the thermal member 230 via an outlet aperture 284, illustrated as two outlet apertures 284, 286. The outlet aperture(s) 284, 286 are formed between the receiving member 130 and the outlet channel 246. The cooling channel 244 is located between the inlet channel 242 and the outlet channel 246.

The fluid control mechanism 160 controls the flow of the fluid 310 into and out of the cooling channel 244 formed between the receiving member 130 and the thermal member 230. For example, without fluid control, i.e., the fluid control mechanism 160, the fluid 310 entering the inlet channel 242 may flow past the inlet aperture 282 for the first thermal member 230, i.e. 230A of FIG. 3. The flow of the fluid 310 past at least one thermal member 230 results in uneven distribution of the fluid 310 and uneven cooling. Similarly, the fluid control mechanism 160, as illustrated in the outlet channels 246, control or slow the flow of the fluid 310 between the outlet apertures 284, 286 and the outlet member 354 as the fluid 310 exits the assembly 100.

FIG. 3 illustrates a schematic view of the flow of the fluid 310 through the assembly 100 according to an example. The fluid 310 enters the assembly 100 through the inlet member 352, illustrated on the lower right corner 353 of the assembly 100. The fluid 310 flows along the entire length of the inlet channel 242. As the fluid 310 enters the inlet channel 242, the fluid 310 first encounters an array of protrusions 262 that slow the flow of the fluid 310. Thereafter, the fluid 310 encounters each of the first plurality of elongated protrusions 264 prior to each thermal member 230. The first plurality of elongated protrusions 264 control the flow of the fluid 310 using resistance, R, such as hydraulic or fluid resistance, to evenly distribute the fluid 310 across each of the thermal members 230. The resistance, R, prevents the fluid 310 from flowing past any one of the inlet apertures 282, which would shift the balance of the pressure.

The cooling channel 244 is illustrated as five parallel channels. Five cooling channels 244 and thermal members 230 are illustrated; however there may be, for example, ten or more cooling channels 244 and thermal members 230. The cooling channel 244 enables the fluid 310 to flow across the array of cooling pins 232 in each of the thermal members 230. For example, the cooling channel 244 extends the length of the thermal member 230. The flow of the fluid 310 across each of the thermal members 230 is intended to provide uniform cooling of the heat received by the thermal member 230 from the electronic device. As the fluid 310 moves along the cooling channel 244 and across the thermal members 230, the cooling channel 244 directs the fluid 310 across the thermal members 230.

The fluid 310 exits to the outlet channel 246 via outlet apertures, illustrated as two outlet apertures 284, 286. The outlet apertures 284, 286 are along the outlet channel 246 and the fluid 310 flows across the thermal members 230 towards the outlet channel 246. The fluid 310 then flows along the outlet channel 246 toward the outlet member 354. The fluid 310 encounters at least one of the second plurality of elongated protrusions 266. The second plurality of elongated protrusions 266 slow the flow of the fluid 310 as it moves towards the outlet member 354 illustrated on the top left corner 355. As the fluid 310 reaches the outlet member 354 the fluid 310 exits the assembly 100. FIG. 3 illustrates an example of the inlet member 352 and the outlet member 354 arranged such that the fluid 310 enters the assembly 100 at the bottom corner 353 exits at the top corner 355 of the assembly 100, which enables any trapped gases mixed with the fluid flow to escape through the outlet member 354.

Figure 4A:
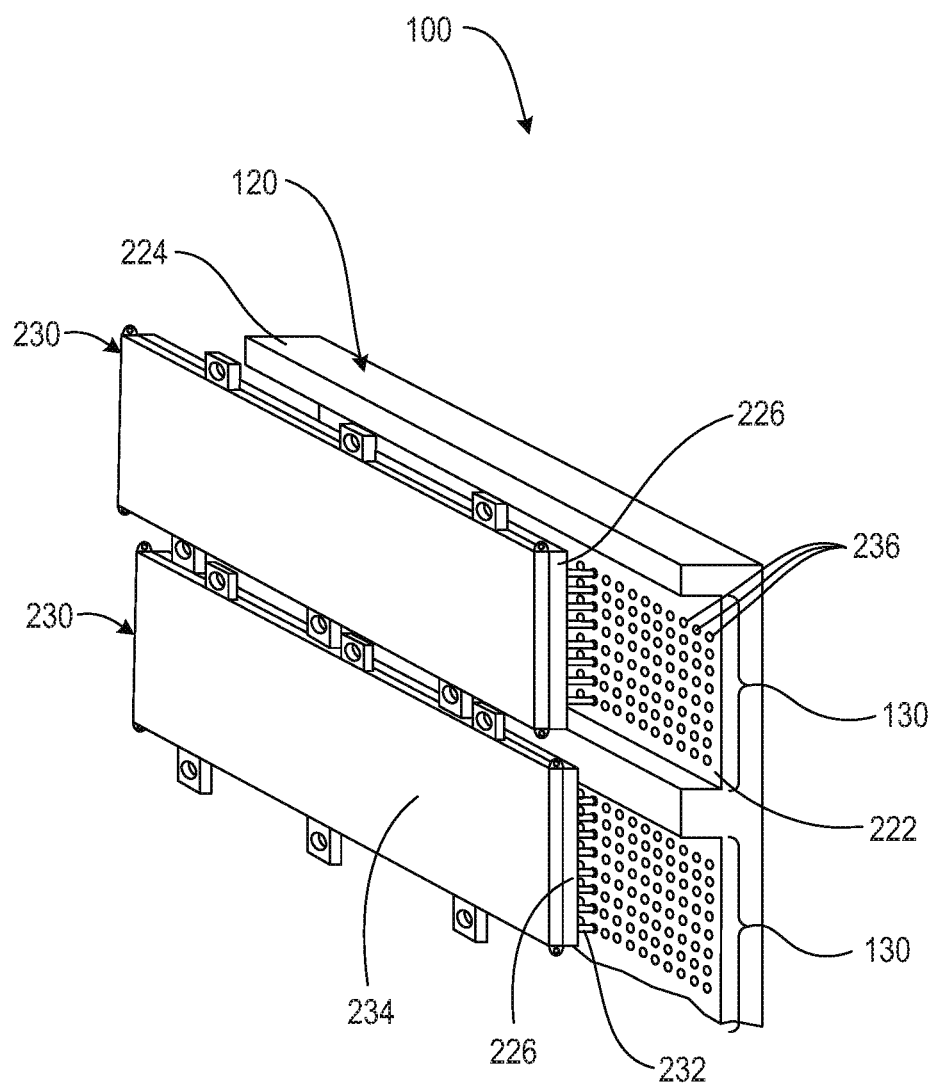
FIG. 4A illustrates an exploded view of a portion of the assembly according to an example.

FIG. 4A illustrates an exploded view of a portion of the assembly according to an example. The exploded view includes a portion of the thermal member 230 and the support member 120 of FIG. 2. The thermal member 230 is illustrated as connectable to the base portion 222 of the support member 120. The thermal member 230 includes the array of cooling pins 232 on one side and the mating member 234 on an opposite side. The array of cooling pins 232 extend towards the receiving member 130 formed in the support member 120. For example, the receiving member 130 includes an array of receiving portions 236 that receive and engage with the array of cooling pins 232. The receiving portions 236 and the array of cooling pins 232 may also engage to increase contact between the fluid 310 and the array of cooling pins 232 as the fluid 310 flows therebetween. For example, the engagement between the array of cooling pins 232 and the receiving portions 236 may reduce the chance of the fluid 310 bypassing the array of cooling pins as the fluid 310 flows therebetween.

The thermal member 230 is positioned adjacent to an electronic device to receive heat from the electronic device. An example of the electronic device includes a server. The electronic device may include a condenser plate or a heat block that mates with the mating member 234 and transfers heat thereto. The contact between the mating member 234 and the heat block transfers the heat therebetween and provides a dry disconnect between the thermal member 230 and the electronic device. The array of cooling pins 232 aid in removal of the heat from the thermal member 230. The array of cooling pins 232 receives fluid 310 from the inlet channel 242 and distributes the fluid 310 over the array of cooling pins 232. As the fluid 310 moves across the array of cooling pins 232, the heat transfers from the thermal member 230 to the fluid 310, which results in removal of heat from the heat block via the thermal member 230.

Figure 4B:
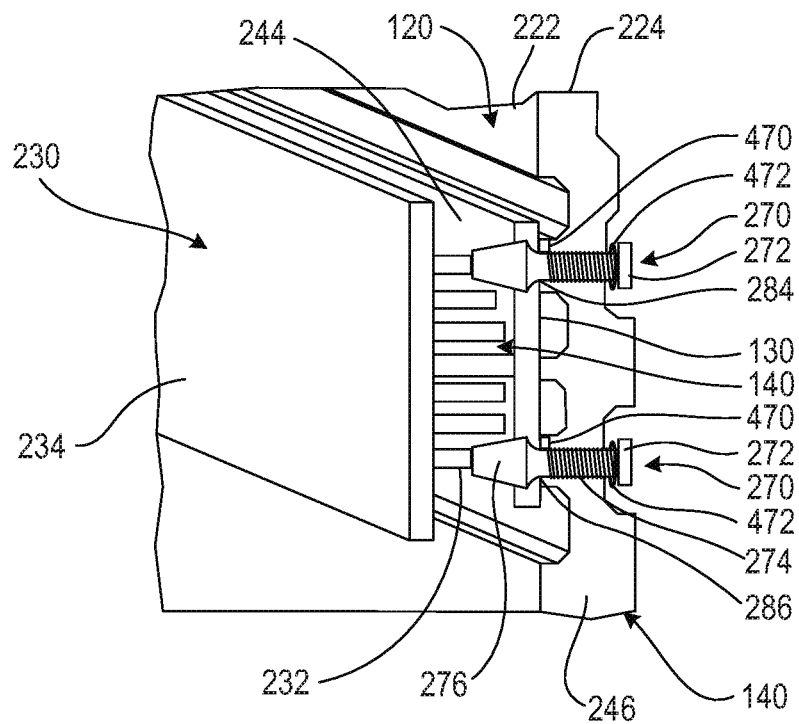
FIG. 4B illustrates a cross-sectional view of a portion of the assembly according to an example.

FIG. 4B illustrates a cross-sectional view of a portion of the assembly 100 according to an example. Referring to FIG. 4B, the assembly 100 includes the support member 120, the receiving member 130, the thermal member 230, the array of cooling pins 232, the mating member 234, and a thermally actuated valve 270. The support member 120 includes the receiving member 130 with the thermal member 230 connected thereto. The thermally actuated valve 270 extends between the support member 120 and the thermal member 230. For example, the support member 120 is illustrated to include the outlet apertures 284, 286 along the outlet channel 246.

The thermally actuated valve 270 extends through and within each of the outlet apertures 284, 286. The thermally actuated valves 270 are adjacent to and/or connected to the thermal member 230 and control the flow of the fluid 310 therebetween. For example, the thermally actuated valves 270 control the effective aperture opening as a function of the fluid 310 temperature. In other words, the fluid 310 at a predefined temperature causes the thermally actuated valves 270 to extend and increase the aperture openings 284, 286. While at a lower temperature, the thermally actuated valves 270 may be fully retracted, thereby decreasing the aperture openings 284, 286.

The thermally actuated valves 270 may also control the removal of the fluid 310 by blocking the outlet apertures 284, 286 until a predefined temperature is attained. For example, the thermally actuated valves 270 retard heat removal if the fluid 310 is less than the predefined temperature. The use of the thermally activated valves 270 to regulate flow of the fluid 310 may reduce the volume of the water flowing through the channel. The thermally actuated valves 270 may also improve performance in "energy reuse" applications, such as using "waste" heat from a server rack to heat a building.

Figure 4C:
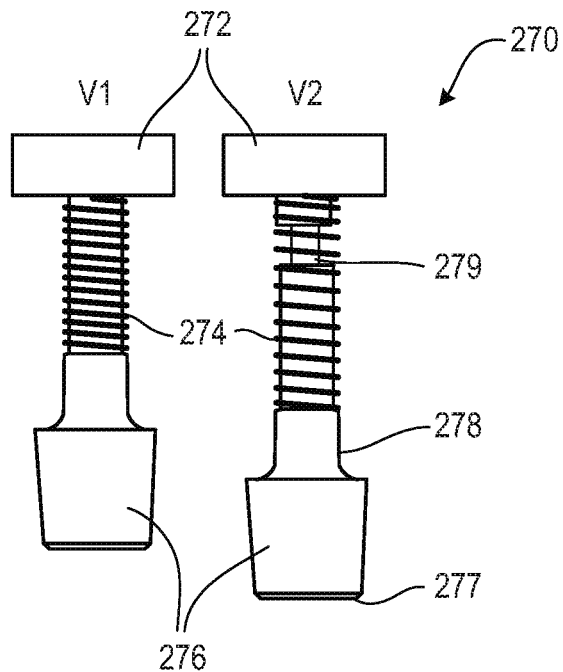
FIG. 4C illustrates an enlarged view of a thermally actuated valve of FIG. 4B according to an example.

FIG. 4C illustrates an enlarged view of a thermally actuated valve 270 of FIG. 4B according to an example. The thermally actuated valve 270 includes a valve fitting 272, a resilient member 274, and a valve body 276. The valve fitting 272 includes, for example, a threaded installation fitting within the valve fitting 272. The valve fitting 272 is fastened to the support member 120, such that the valve fitting 272 is securely attached and not moveable. Referring back to FIG. 4B, an O-ring seal 472 is fitted to the valve fitting 272 between the threaded installation fitting and the support member 120 to seal the surface therebetween from leaking.

The valve body 276 is illustrated as a hollow "bell" chamber 278 that contains the wax member 277 in the hollow "bell" chamber 278. The wax member 277 expands as the temperature of the fluid 310 contacting the valve body 276 increases in temperature. The expansion of the wax member 277 causes a diaphragm (not shown) within the hollow "bell" chamber 278 to press on a rod 279 that extends from the valve fitting 272 into the center of the valve body 276. The valve fitting 272 and rod 279 do not move since the valve fitting 272 is fastened to the support member 120. However, the pressure on the rod 279 causes the valve body 276 to extend into the cooling channel 244 formed between the thermal member 230 and the receiving member 130 enables the flow of the fluid 310 through the outlet apertures 284 and 286 as the thermally actuated valve 270 extends.

The resilient member 274 enables the valve fitting 272 to extend and retract based on the thermal expansion and contraction of the wax member 277 within the valve body 276. The resilient member 274 is illustrated as a return spring. For example, the resilient member 274 provides a return force that retracts the resilient member 274 as the temperature of the wax decreases and the wax member 277 contracts. The retraction of the resilient member 274 causes the rod 279 to retract and restrict the flow of the fluid 310 past the thermally actuated valve 270 when closed.

Referring to FIG. 4C, the thermally actuated valve 270 is illustrated as moving between positions V1 and V2. In V1, the thermally actuated valve 270 is retracted, and in V2, the thermally actuated valve 270 is extended. The wax member 277 contracts, i.e. position V1, as the temperature of the fluid 310 decreases in the thermal member 230, as determined by the thermally actuated valve 270. Contraction of the valve body 276 causes the resilient member 274 to retract and the return force of the resilient member 274 moves the valve body 276 such that the amount of fluid 310 that flows out of the assembly 100 decreases. For example, the amount of fluid 310 that flows out of the outlet apertures 284, 286 decreases, which results in the total flow out of the assembly 100 to also decrease.

Conversely, the wax member 277 expands, i.e. position V2, as the temperature of the fluid 310 increases in the thermal member 230. Expansion of the wax member 277 in the valve body 276 causes the fluid 310 to flow more freely as the valve body 276 moves further into the thermal member 230. Expansion of the valve body 276 causes the resilient member 274 to extend and move the valve body 276 such that the amount of fluid 310 that flows out of the assembly 100 increases. For example, the amount of fluid 310 that flows out of the outlet apertures 284, 286 increases, which results in the total flow out of the assembly 100 to also increase.

Even when the thermally actuated valve 270 is closed, a small amount of fluid 310 continuously flows out of cooling channel 244, into the outlet channel 246, and out of the assembly 100 through the outlet member 354. The small amount of fluid 310 is continuously released via, for example, a fluid release member 470. FIG. 4B illustrates the fluid release member 470 as a small aperture extending from the outlet apertures 284, 286. The fluid release member 470 allows air to escape from the thermal member 230 when the fluid 310 initially flows across the thermal member 230. Thereafter, the fluid release member 470 allows a small continual flow of fluid 310 through the assembly 100. The fluid release member 470 is optional and may be used to ensure that fluid contacting the thermally actuated valve 270 is representative of the temperature of the fluid 310 in the thermal member 230.

The release of the heated fluid 310 via the thermally actuated valves 270 also enables the fluid 310 at a lower temperature to be continually supplied, which regulates the temperature of the fluid 310 that flows across the array of cooling pins 232 and continually enables removal of heat from the thermal member 230. It should be noted that the thermally actuated valves 270 are intended to alter the flow of the fluid 310. For example, the thermally activated valves 270 may limit the flow of the fluid 310 to only allow the fluid 310 to exit when the fluid 310 reaches a predefined temperature. By regulating the temperate at which the fluid 310 exits the thermal member 230 and the assembly 100, the heat contained within the fluid 310 may be consistently reused for other purposes, such as heating a building that houses the electronic device.

Figure 5:
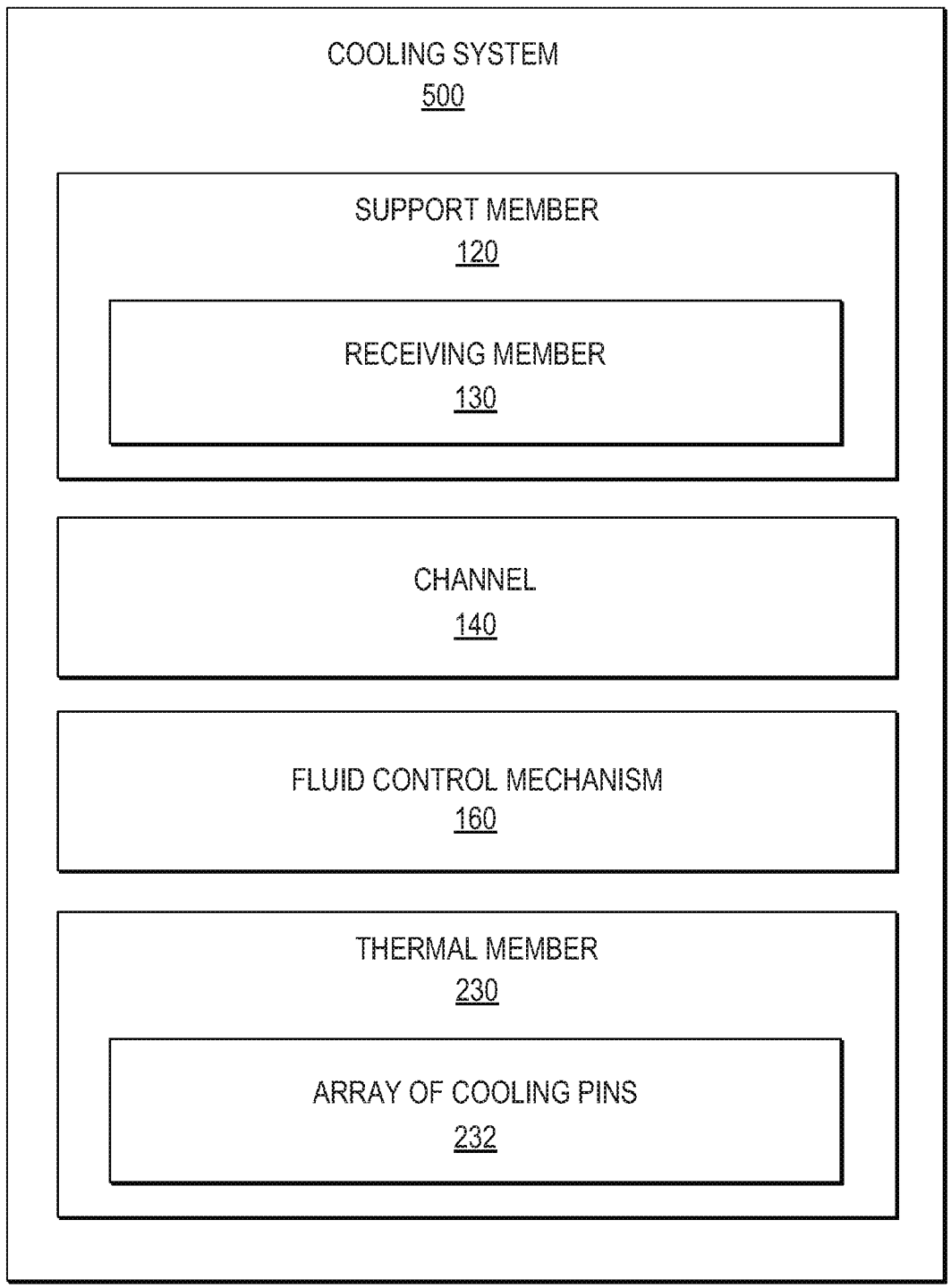
FIG. 5 illustrates a block diagram of a cooling system according to an example.

FIG. 5 illustrates a block diagram of a cooling system 500 according to an example. A cooling system 500 includes a support member 120, a receiving member 130, a channel 140, a fluid control mechanism 160, and a thermal member 230. The support member 120 supports a plurality of thermal members 230. The support member 120 includes a plurality of receiving members 130 formed in the support member 120. Each of the receiving members receives one of the plurality of thermal members 230.

The support member 120 is a structural member that is positioned in proximity to or adjacent to an electronic device. The support member 120 supports a thermal member. The support member 120 includes the receiving member 130. The receiving member 130 is formed to receive a thermal member 230 that receives heat from an electronic device.

Referring back to FIG. 2, the support member 120 includes a base portion 222 and a cover portion 224 connectable to the base portion 222. The base portion 222 and the cover portion 224 may be connected to one another using, for example, a fastener 220, such as a clip, a screw, and/or adhesive that holds the base portion 222 and the cover portion 224 together. For example, a seal member 226, such as a gasket, is used to provide a fluid-tight seal between the base portion 222 and the cover portion 224 and/or between the base portion 222 and the thermal member 230.

The channel 140 is formed within the support member 120 to carry a fluid 310 therethrough. For example, the channel 140 is formed within the support member 120 between the base portion 222 and the cover portion 224 to carry a fluid 310 therebetween. The channel 140 receives the fluid 310, provides and/or distributes the fluid 310 to a thermal member, and removes the fluid 310 from a thermal member and/or the support member 120. The channel 140 may include one or a plurality of channels or portions depending on the configuration of the support member 120.

As illustrated in FIGS. 2-3, the channel 140 includes an inlet channel 242, a cooling channel 244, and an outlet channel 246. The inlet channel 242 receives the fluid 310 and distributes the fluid 310 across the thermal member 230. The outlet channel 246 removes the fluid 310 received from the thermal member 230. The outlet channel 246 and the inlet channel 242 are connectable to a thermal member 230.

The thermal member 230 may be directly connected to the inlet channel 242 and the outlet channel 246, such that the cooling channel 244 is formed between the thermal member 230 and the receiving member 130. For example, the cooling channel 244 is a channel or cavity formed between the base portion 222 and the thermal member 230 that the fluid 310 to flow therethrough, such that the fluid flows across the array of cooling pins 232. The inlet channel 242 may receive the fluid 310 via an inlet member 352 connected to the inlet channel 242, and remove the fluid 310 from the assembly 100 via an outlet member 354 connected to the outlet channel 246, as illustrated in FIGS. 2-3. Alternatively, the thermal member 230 may be connected to a supplemental channel that extends from the inlet channel 242 and the outlet channel 246 and connects to the thermal member 230. The supplemental channel provides and/or distributes the fluid 310 to a thermal member 230 such that the fluid 310 flows across the array of cooling pins 232 and receives the fluid 310 from the thermal member 230.

The fluid control mechanism 160 is along or formed in the channel 140 to control the flow of the fluid 310 therethrough and across the thermal members 230. For example, the fluid control mechanism 160 evenly distributes the fluid 310 among the plurality of thermal members 230. The fluid control mechanism 160 controls the flow of the fluid 310 through the channels 140, i.e., the inlet channel 242 and the outlet channel 246. The fluid control mechanism 160 also controls the flow of the fluid 310 at various locations within the channel 140, such as the flow of the fluid 310 across the thermal members 230 and along the outlet channel 246 as the fluid 310 exits the support member 120.

As illustrated in FIG. 3, the fluid control mechanism 160 includes a protrusion in the inlet channel 242 and the outlet channel 246 that resists the flow of the fluid 310 such that the fluid is evenly distributed across each of the thermal members 230A-E. In other words, approximately the same velocity and pressure of fluid 310 is distributed across the first thermal member 230A and the last thermal member 230E.

The fluid control mechanism 160 of FIG. 3 includes an array of protrusions 262 along the inlet channel 242 in proximity to the inlet member 352, a first plurality of elongated protrusions 264 along the inlet channel 242, and a second plurality of elongated protrusions 266 along the outlet channel 246. The array of protrusions 262 that extend across the inlet channel 242 initially resist the flow of the fluid 310 as it enters the inlet channel 242. The first plurality of elongated protrusions 264 are illustrated as semi-cylindrical protrusions located before each of the thermal members 230 to resist the flow of the fluid 310. For example, the first plurality of elongated protrusions 264 evenly distribute the fluid 310 to the cooling channels 244 via the inlet apertures 282 and provide each of the thermal members 230 with the fluid 310 having approximately the same velocity and pressure. Without the fluid control mechanism 160 in the inlet channel 242, the fluid 310 may flow past at least one of the thermal members 230 resulting in little or no fluid 310 being received by the inlet aperture 282.

The second plurality of elongated protrusions 266 resist the flow of fluid 310 between the thermal members 230 and the outlet channel 246 as the fluid moves out of the support member 120. For example, the fluid control mechanism 160 in the outlet channels 246, control or slow the flow of the fluid 310 between the outlet apertures 284, 286 and the outlet member 354 as the fluid 310 exits the support member 120. The second plurality of elongated protrusions 266 are illustrated as semi-cylindrical protrusions located after each of the thermal members 230 to control the flow of the fluid 310 as it moves along the outlet channel 246.

As illustrated in FIG. 3, the same number of first and second plurality of elongated protrusions 264, 266 are located in the inlet channel 242 and the outlet channel 246. The symmetry enables the flow of the fluid 310 to be similarly controlled in both channels 242, 246. For example, the fluid 310 flows over the same number of protrusions 264, 266 entering through the inlet channel 242 and exiting through the outlet channel 246, regardless of the thermal member 230A-E that the fluid 310 flows into and through. The symmetry helps to ensure an even flow resistance, R, across all of the thermal members 230.

A thermal member 230 is installed in each of the receiving members 130 illustrated in FIG. 2. Referring back to FIGS. 2-4A, the thermal member 230 includes the array of cooling pins 232 and a mating member 234. The array of cooling pins 232 are on one side and the mating member 234 is on an opposite side. The array of cooling pins 232 extend towards the receiving member 130 formed in the support member 120. For example, the receiving member 130 includes an array of receiving portions 236 that receive and engage with the array of cooling pins 232. The array of cooling pins 232 receive the fluid 310 from the inlet channel 242, which distributes the fluid 310 over the array of cooling pins 232.

The thermal member 230 extends between the inlet channel 242 and the outlet channel 246. The thermal member 230 receives the fluid 310 via an inlet aperture 282 formed between the receiving member 130 and the inlet channel 242. The fluid 310 exits the thermal member 230 via an outlet aperture 284, illustrated as two outlet apertures 284, 286. The outlet aperture(s) 284, 286 are formed between the receiving member 130 and the outlet channel 246. The cooling channel 244 is located between the inlet channel 242 and the outlet channel 246. The cooling channel 244 is formed between the receiving member 130 and the thermal member 230, such that the fluid 310 flows across the thermal member 230 contacting the array of cooling pins 232 as it flows therethrough.

The cooling system 500 may further include a thermally actuated valve 270. The thermally actuated valve 270 controls the amount of the fluid 310 that flows out of the cooling channel 244. The thermally actuated valve 270 is illustrated in detail above in FIGS. 4B-4C. Although, the fluid control mechanism 160 controls the flow to provide an even distribution of the fluid 310, the thermally actuated valves 270 are intended to alter the flow of the fluid 310. For example, the thermally activated valves 270 may limit the flow of the fluid 310 to only allow the fluid 310 to exit when the fluid 310 reaches a predefined temperature. At such times, the thermally actuated valves 270 are not all open and the flow of the fluid 310 is not balanced. The flow of the fluid 310 is balanced when all of the thermally actuated valves 270 remain open. The thermally actuated valves 270 allow a relatively uniform coolant exit temperature to be maintained regardless of the power dissipated in each server, and allow flow balancing to respond to uneven power levels.

Figure 6A:
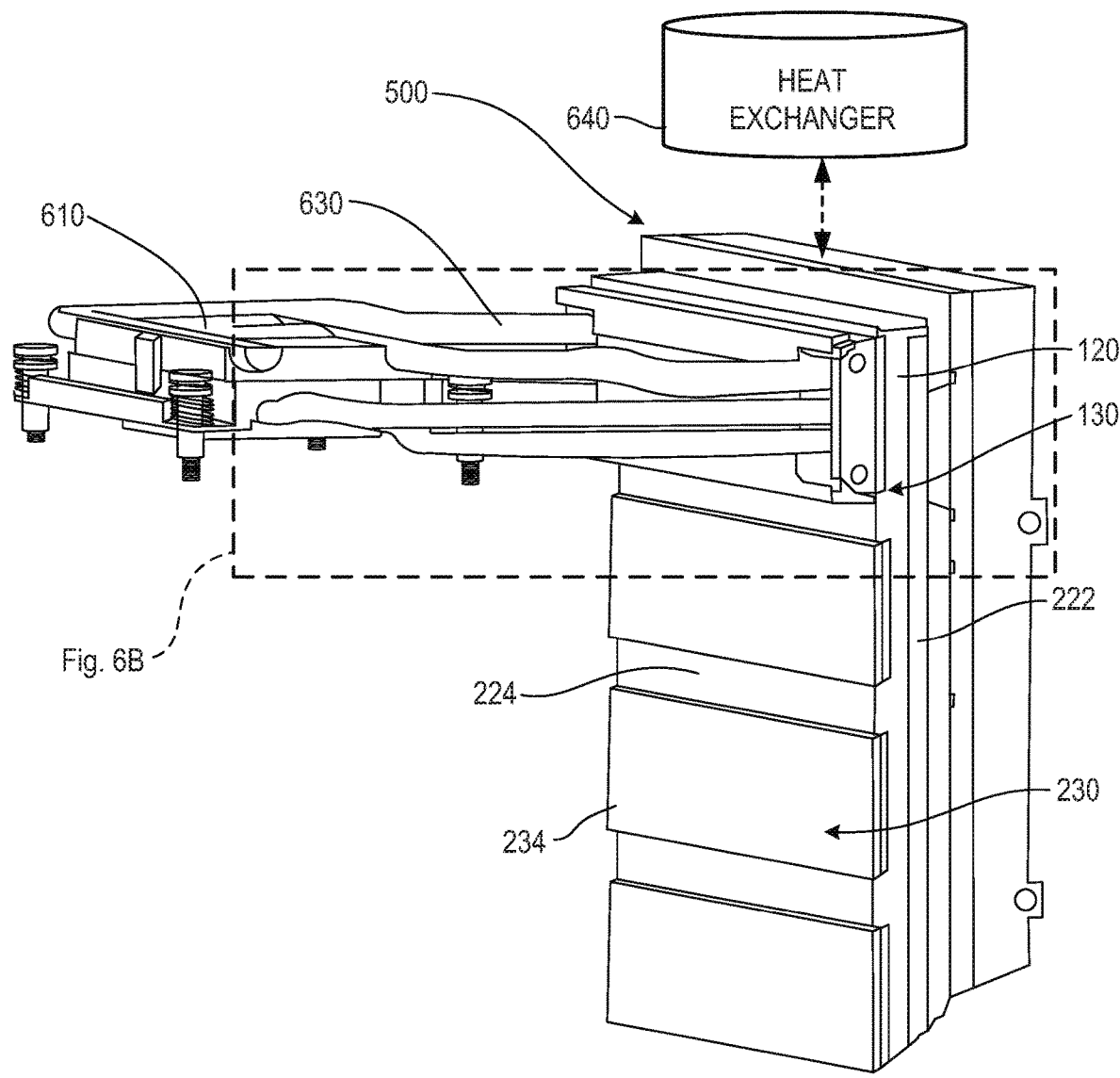
FIG. 6A illustrates a schematic diagram of the cooling system of FIG. 5 according to an example.
Figure 6B:
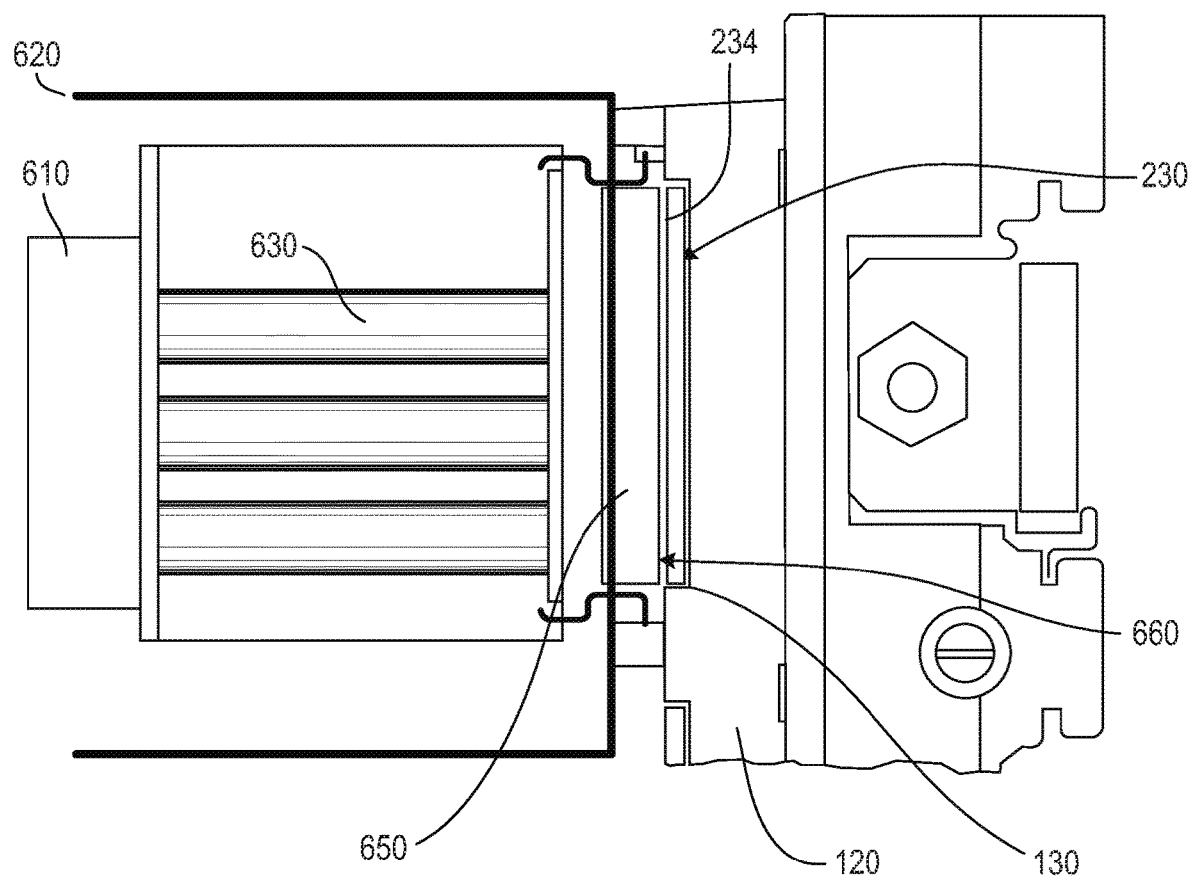
FIG. 6B illustrates an enlarged view of the cooling system of FIG. 6A according to an example.

FIGS. 6A-6B illustrate schematic diagrams of the cooling system 500 of FIG. 5 according to an example. The cooling system 500 includes the assembly 100, including the support member 120 with the receiving member 130, the channel 140, a fluid control member 160, and a thermal member 230 with an array of cooling pins 232 and a mating member 234. As illustrated in FIG. 6A, the cooling system 500 further includes a heat sink 610, heat pipes 630, and a heat exchanger 640. FIG. 6B illustrates an enlarged view of the cooling system 500 of FIG. 6A according to an example. The cooling system 500 of 6B includes an electronic device 620, such as a server within a server enclosure.

Referring to FIGS. 6A-6B, the heat sink 610 is connected to heat pipes 630. The heat pipes 630 remove heat from the electronic device 620. The heat pipes 630 are connected to a heat block 650 or a condenser plate that takes the heat from the heat pipes 630. The heat block 650 connects to a mating member 234 of the thermal member 230. The connection between the heat block 650 and the mating member 234 of the thermal member 230 is a dry disconnect 660. The dry disconnect 660 as illustrated in FIG. 6B uses contact between the surface of the mating member 234 and the surface of the heat block 650 to transfer heat therebetween. This is referred to as a dry disconnect since no fluid 310 is exchanged between the heat block 650 and the thermal member 230. Instead heat is transferred by conduction through the surfaces.

The cooling system 500 enables the use of a small amount of fluid with a very low risk of damage to the electronic device in the heat pipes 630 to remove the heat from the electronic equipment. As illustrated and described above in FIGS. 2-4B, the heat from the electronic equipment is then transferred to the thermal member 230 for liquid cooling. The liquid cooling occurs away from the electronic device, which provides efficient cooling and reduces the risk of leakage within the electronic device. For example, in a server the liquid cooling occurs at the rack level instead of the server level. The heat is transported from the central processing unit and other electronic devices to the outer surface of server without the risk of fluid 310 leakage within the server. The liquid cooling then occurs in components that reside at the rack level instead of the server level, i.e., within each individual server. Liquid cooling at the rack level protects the server from damage due to leakage from liquid cooling.

The heat from the heat block 650 is transferred to the fluid 310, via the thermal members 230 connected to the support member 120, i.e., the receiving member 130. As illustrated above in FIGS. 2-4B, the fluid 310 flows into the inlet channel 242 and through the cooling channel 244 to receive heat from the thermal member 230 via the array of cooling pins 232. The heat is transferred from the thermal member 230 to the fluid 310. For example, the array of cooling pins 232 receives the fluid 310, i.e., fluid at a lower temperature, via the inlet member 352 and the inlet channel 242. The fluid 310 flows over the array of cooling pins 232 and the heat is transferred to the fluid 310. The fluid 310, i.e., fluid at a higher temperature, is removed from the thermal member 230 and out of the support member 120 via the outlet channel 246 and the outlet member 354.

The assembly 100 may be connected to a cooling mechanism, such as a heat exchanger 640 that removes the heat from the fluid 310. For example, the cooling mechanism may be a heat exchanger 640 located on or attached to a server rack and/or at a cooling facility separate from the server rack. The cooling mechanism is connected to support member 120, i.e., the receiving member 130 between the outlet member 354 and the inlet member 352 to recycle the fluid 310 from the outlet channel 246 and provide the inlet channel 242 with fluid 310 at a lower temperature. For example, the heat exchanger 640 reduces a temperature of the fluid 310 from the outlet channel 246 and sends the fluid 310 with a lower temperature to the inlet channel 242. The fluid 310 is then reusable and the liquid cooling process may continue using the recycled fluid 310.

Figure 7:
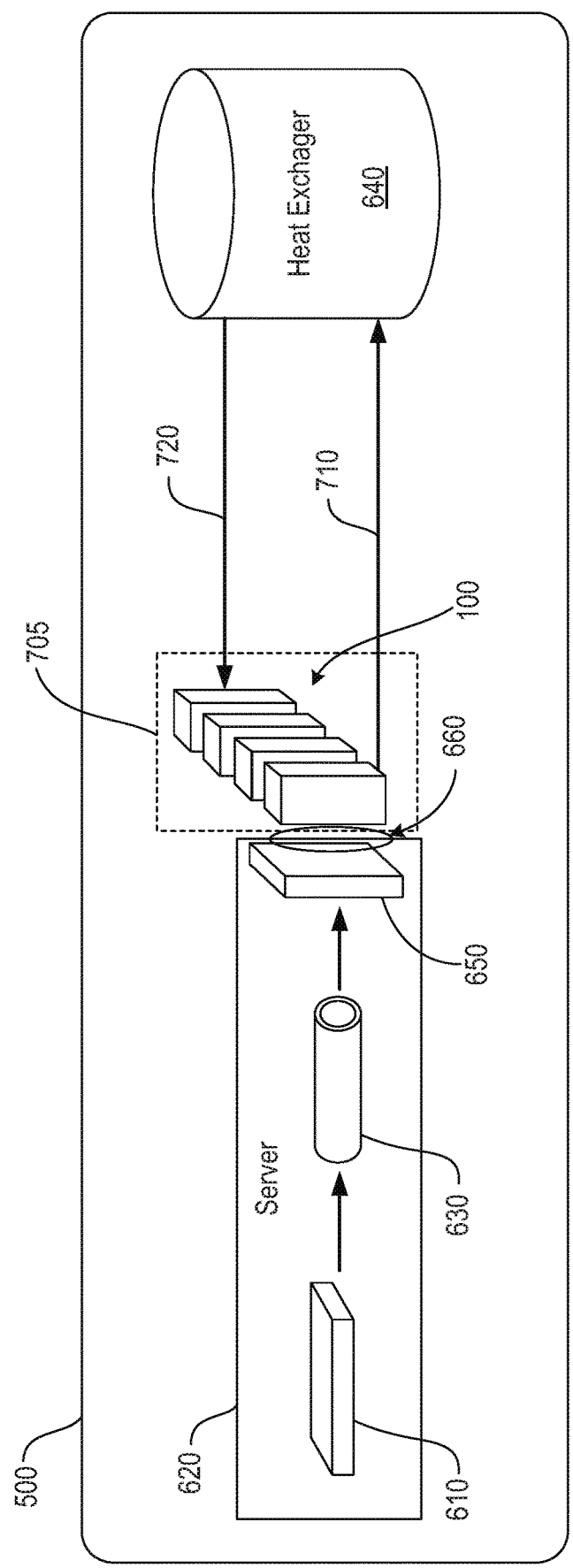
FIG. 7 illustrates a perspective diagram of the cooling system of FIG. 5 according to an example.

FIG. 7 illustrates a perspective diagram of the cooling system 500 of FIG. 5 according to an example. The cooling system 500 illustrates how heat from an electronic device 620, such as a server within a server enclosure is collected at the heat sink 610. The heat leaves the heat sink 610 via heat pipes 630. The heat is transferred from the heat pipes 630 to a heat block 650 that provides a dry disconnect 660 between the electronic device 620 and the thermal member 230. For example, the dry disconnect 660 is between the server and the server rack 705 that includes the support member 120, the receiving member 130, the channel 140, and thermal member 230 as described above.

As illustrated in FIGS. 3, 6A-6B, the heat is transferred to the thermal member 230. The heat is transferred from the thermal member 230 to the fluid 310 using the array of cooling pins 232. The heat exits the thermal member 230 with the fluid 310, for example the fluid 310 at a higher temperature. The fluid 310 at the higher temperature is removed from the assembly 100, via, for example, the outlet member 354 of FIG. 3. Referring back to FIG. 7, once removed from the assembly 100, the fluid 310 is sent 710 to a cooling facility that removes the heat from the fluid 310 using a cooling mechanism, such as a heat exchanger 640. The fluid 310 with the heat removed therefrom, for example a fluid 310 at a lower temperature, is sent back 720 to the inlet channel 242, via, for example, the inlet member 352 of FIG. 3, and through the thermal member 230 as the process repeats.

The modular design of the cooling system 500 simplifies manufacturing, assembly, and maintenance. For example, the electronic device includes a heat block 650 that lines up with the support member 120 and the thermal member 230. The other aspects of the electronic device, such as the heat pipes 630 and heat sink 610 may vary and be interchangeable. Moreover, the modular nature of the cooling system 500 makes it easier to maintain electronic devices, such as allowing for removal of one of the servers without disrupting the other servers.

FIG. 8 illustrates a flow chart 800 of a method to cool an electronic device according to an example. The method is usable with a cooling system. The cooling system receives heat from an electronic device in block 820. The cooling system includes a support member, a channel, a fluid control mechanism, and a thermal member. The support member supports a thermal member. The channel is formed within the support member to carry a fluid therethrough. The channel receives the fluid, provides and/or distributes the fluid across a thermal member, and removes the fluid from a thermal member. The fluid control mechanism is along the channel to control the flow of the fluid therethrough.

The thermal member is positioned adjacent to a heat block that receives heat from the electronic device and receive fluid thereacross. The thermal member includes an array of cooling pins that extend towards the support member. The thermal member removes the heat from the heat block. For example, the array of cooling pins are positioned on one side of the thermal member and a mating member is positioned on an opposite side. The mating member is positioned to receive the heat from the heat block. The array of cooling pins transfer heat the fluid when fluid is present and in contact with the array of cooling pins.

In block 840, the fluid is distributed to the cooling system. In order to remove the heat from the thermal member, the fluid is distributed over the thermal member via the channel. The fluid is distributed over the array of cooling pins. As the fluid contacts the array of cooling pins and the heat transfers from the thermal member to the fluid. The fluid with the heat (i.e., fluid at a higher temperature) is removed from the cooling system in block 860. The fluid may be removed from the thermal members via the channel and then removed from the support member through an outlet member.

The method may reuse or recycle the fluid using, for example, a heat exchanger. The fluid is carried from the thermal member out of the support member via the channels and the outlet member to the heat exchanger. The heat exchanger reduces a temperature of the fluid. The fluid is then returned to the channel and distributed across the thermal member via the inlet member.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. An assembly, comprising:
   a support member to support a thermal member, the support member including a receiving member formed therein to receive the thermal member;
   the thermal member is connected to the receiving member, the thermal member including:
   a thermally conductive surface on one side; and
   a mating member on an opposite side of the thermally conductive surface; and
   a channel formed within the support member to carry a fluid across the thermal member, wherein the mating member is positioned adjacent to a heat block such that the heat block transfers heat from an electronic device to the thermal member via the mating member.

2. The assembly of claim 1, wherein the fluid contacts the thermally conductive surface of the thermal member to remove the heat from the electronic device.

3. The assembly of claim 1, wherein the channel is to:
   receive the fluid;
   distribute the fluid across the thermal member; and
   remove the fluid from the thermal member.

4. The assembly of claim 1, wherein the channel further comprises:
   an inlet channel to receive and distribute the fluid across the thermal member; and
   an outlet channel connected to the thermal member to remove the fluid from the thermal member.

5. The assembly of claim 4, wherein the channel further comprises:
   a cooling channel extending between the inlet channel and the outlet channel to carry the fluid across the thermally conductive surface of the thermal member.

6. The assembly of claim 4, further comprising a heat exchanger between the outlet channel and the inlet channel to recondition the fluid from the outlet channel and provide the inlet channel with the fluid.

7. The assembly of claim 1, wherein the support member includes a base portion and a cover portion connectable to the base portion.

8. The assembly of claim 1, wherein heat is transferred by conduction from the heat block contacting the surface of the mating member opposite the thermally conductive surface.

9. The assembly of claim 1, wherein the channel removes heat from the thermal member by removing the fluid.

10. The assembly of claim 1, wherein the thermal member is affixed to a surface of the receiving member such that the thermal member covers the receiving member.

11. A cooling system comprising:
    a support member to support a plurality of thermal members, the support member including a plurality of receiving members formed therein to receive the plurality of thermal members;
    the plurality of thermal members include:
    a thermally conductive surface on a first side; and
    a mating member on a second side to mate to a receiving member of the plurality of receiving members, wherein the mating member is positioned adjacent to a heat block such that the heat block transfers heat from an electronic device to the plurality of thermal members via the mating member; and
    a channel formed within the support member to control the flow of a fluid across the plurality of thermal members.

12. The cooling system of claim 11, further comprising:
    an inlet channel to receive the fluid and distribute the fluid across the plurality of thermal members; and
    an outlet channel to remove the fluid therefrom.

13. The cooling system of claim 12, further comprising a plurality of cooling channels extending between the inlet channel and the outlet channel, wherein the plurality of cooling channels is formed between one of the plurality of receiving members and one of the plurality of thermal members.

14. The cooling system of claim 11, wherein the fluid contacts the thermally conductive surface of each of the plurality of thermal members.

15. The cooling system of claim 11, wherein the thermally conductive surface is located in the channel, such that the fluid contacts the thermally conductive surface to remove heat from the thermally conductive surface.

16. A computing device, comprising:
    an electronic device with a cooling system, the cooling system includes:
    a support member to support a thermal member;
    a channel formed within the support member to carry a fluid therethrough; and
    the thermal member positioned adjacent to a heat block that receives heat from the electronic device, the thermal member includes a thermally conductive surface on a first side, and a mating member on a second side of the thermally conductive surface; and the channel to carry the fluid across the thermally conductive surface of the thermal member, and as the fluid contacts the thermally conductive surface, the heat transfers from the thermal member to the fluid, and the channel removes the fluid with the heat from the thermal member.

17. The computing device of claim 16, wherein the channel is to:

receive the fluid;

distribute the fluid across the thermal member; and remove the fluid from the thermal member.

18. The computing device of claim 16, further comprising:

a heat exchanger to receive the fluid from the thermal member, wherein the heat exchanger reduces a temperature of the fluid and provides the fluid from the heat exchanger back across the thermal member.

19. The computing device of claim 16, wherein the mating member is positioned adjacent to the heat block such that the heat block transfers heat from the electronic device to the thermal member via the mating member.

* * * * *